United States Patent
Kim

(10) Patent No.: US 9,523,744 B2
(45) Date of Patent: Dec. 20, 2016

(54) SENSING APPARATUS USING A PLURALITY OF HALL SENSORS

(71) Applicant: MagnaChip Semiconductor, Ltd., Cheongju-si (KR)

(72) Inventor: Eunjoong Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 365 days.

(21) Appl. No.: 14/276,268

(22) Filed: May 13, 2014

(65) Prior Publication Data
US 2015/0159989 A1    Jun. 11, 2015

(30) Foreign Application Priority Data
Dec. 5, 2013  (KR) .................. 10-2013-0150618

(51) Int. Cl.
G01R 33/07      (2006.01)
G01D 5/14       (2006.01)

(52) U.S. Cl.
CPC ............ G01R 33/072 (2013.01); G01D 5/145 (2013.01)

(58) Field of Classification Search
CPC ...................................................... G01R 33/07
USPC ......................................................... 324/251
See application file for complete search history.

(56) References Cited

U.S. PATENT DOCUMENTS

| | | | |
|---|---|---|---|
| 6,701,166 B2 | 3/2004 | Lim | |
| 2004/0214612 A1* | 10/2004 | Park et al. | 455/566 |
| 2010/0234073 A1* | 9/2010 | Kusano | 455/566 |
| 2015/0028236 A1* | 1/2015 | Dolenti et al. | 251/129.01 |

* cited by examiner

Primary Examiner — Bot Ledynh

(57) ABSTRACT

A sensing apparatus and sensing device using the sensing apparatus are capable of identifying a relative position of a body which includes a magnetic module by using sensing data of a sensor unit which may be arranged in a 3 dimensional structure.

18 Claims, 10 Drawing Sheets

10: sensor
31a: sensing region
33: insulating layer
34a, 34b, 34c, 34d: first, second, third, fourth electrodes
35: doping region
50a: first Hall device
50b: second Hall device 31a: sensing region
33: insulating layer
34a, 34b, 34c, 34d: first, second, third, fourth electrodes
35: doping region
50: Hall device 10: sensor
31a: sensing region
33: insulating layer
34a, 34b, 34c, 34d: first, second, third, fourth electrodes
35: doping region
50a: first Hall device
50b: second Hall device

SENSING APPARATUS USING A PLURALITY OF HALL SENSORS

CROSS-REFERENCE TO RELATED APPLICATION

This application claims the benefit under 35 U.S.C. §119 of Korean Patent Application No. 10-2013-0150618 filed on Dec. 5, 2013, in the Korean Intellectual Property Office, the entire disclosure of which is incorporated herein by reference for all purposes.

BACKGROUND

1. Field

The following description relates to a sensing apparatus using a plurality of Hall sensors and an apparatus using the sensing apparatus thereof. For example, the sensing apparatus is capable of identifying a relative position of a body which comprises an additional magnetic module by using sensing data of a sensor unit where the plurality of Hall sensors are arranged in a 3 dimensional structure.

2. Description of Related Art

Usually, a folding mobile terminal, such as a flip or a cover or a folder type terminal, is configured to connect a channel or operate a lamp of a display module by means of detecting an opening and closing of the cover and controlling a terminal in response. A folding mobile terminal is usually divided into first and second structures and refers to a terminal in which two structures are connected to each other, and the structures are opened or closed (hereinafter "folding mobile terminal"). That is, when a user opens a cover upon receipt of a message or call, a channel is connected; when a user closes a cover, a channel is disconnected. Further, when the user opens a cover, a lamp of the terminal is powered; thus, the user may easily see the display module.

In the above-mentioned terminal, typically, a reed switch made of a magnetic substance having a permanent magnet and elasticity is used to detect an opening and closing of the cover. Further, in various terminal models, by variably amplifying a voltage which is output at a Hall sensor, being of a right shape and size according to the terminal model, sensitivity of a switch is controllable without changing a magnet of the Hall switch or coordinating a distance between the magnet and the magnetic substance.

Typically, only one Hall sensor is used to detect whether the folding mobile terminal is opened or closed. The opening or closing of the folding mobile terminal is identified by judging whether a sensor value obtained by the one sensor is greater than a certain value. That is, the conventional sensing system only detects a magnitude of magnetic force from the magnet. Further, the conventional system operates dichotomously in accordance with the magnitude of the detected value.

In addition, a relative distance between the Hall sensor and the magnet is typically only detected through the one Hall sensor. Also, a relative position of the magnet to a body having the Hall sensor is typically undetectable. Thus, an opening or a closing of the terminal could be misjudged.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a sensing apparatus includes a first sensor unit including a sensor formed on a first plane; and a second sensor unit including another sensor formed on a second plane; wherein the another sensor of the second sensor unit is arranged with the sensor of the first sensor unit in a Z axis direction.

The second plane may be parallel to the first plane by a certain interval, and the another sensor of the second sensor unit may be aligned with the sensor of the first sensor unit in the Z axis direction.

Each sensor of the first and the second sensor units may be a Hall sensor comprising a Hall device which includes a conductive type sensing region configured to detect a change in magnetic field, first and third electrodes that face each other and are configured to measure a current on the sensing region, and second and fourth electrodes that face each other and are configured to be arranged vertically with respect to the first and third electrodes and measure a change in voltage.

The sensing apparatus may further include a first sensor packaging module comprising the first sensor unit; and a second sensor packaging module including the second sensor unit.

The first sensor packaging module and the second sensor packaging module may be stacked.

The another sensor of the second sensor unit may be aligned with the sensor of the first sensor unit.

The another sensor of the second sensor unit may be not aligned with the sensor of the first sensor unit.

In another general aspect, a device using a sensing apparatus may include a first body, a second body, including a magnetic module, configured to be attachable and detachable with the first body, and a sensor unit comprising a plurality of sensors arranged in a 3 dimensional structure at the first body.

The device may further include a controller configured to determine a relative position of the second body with respect to the first body by using values sensed by each of the plurality of sensors of the sensor unit, wherein the sensor unit is formed at a side of the first body to sense a magnetic force formed at the second body.

Each sensor of the sensor unit may be a Hall sensor including a Hall device which includes a conductive type sensing region configured to detect a change in magnetic field; first and third electrodes that face each other and are configured to measure a current on the sensing region; and second and fourth electrodes that face each other and are configured to be arranged vertically with respect to the first and third electrodes and measure a change in voltage.

The sensor unit may include a first sensor unit comprising a sensor formed on a first plane; and a second sensor unit comprising another sensor formed on a second plane that is parallel to the first plane by a certain interval.

The another sensor of the second sensor unit may be arranged with the sensor of the first sensor unit in a Z axis direction.

The controller may be configured to identify a relative position of the second body with respect to the first body by comparing values sensed by each sensor of the first and the second sensor units that are arranged in a Z axis direction.

The controller may be configured to determine whether the second body is attached to the first body by using the determined relative position data of the second body with respect to the first body.

The first sensor unit may include other sensors, and the another sensor of the second sensor unit is positioned in a Z axis direction with respect to the first sensor unit and between the sensors of the first sensor unit.

In another general aspect, a device includes a first body, a second body, a first sensor and a second sensor arranged at the first body on a first plane, and a third sensor which is vertically aligned with the first sensor in a z axis direction and arranged at a second plane of the first body which is parallel to the first plane.

The first, second, and third sensors may be configured to provide values for determining a relative position of the second body with respect to the first body.

The device may further include a controller, wherein in response to the values provided by the first, second, and third sensors, the controller generates a control signal.

The device may further include a magnetic module which is formed at the second body and generates magnetic forces which are detected by the first, second, and third sensors for determining a relative position of the second body with respect to the first body.

Figure 1:
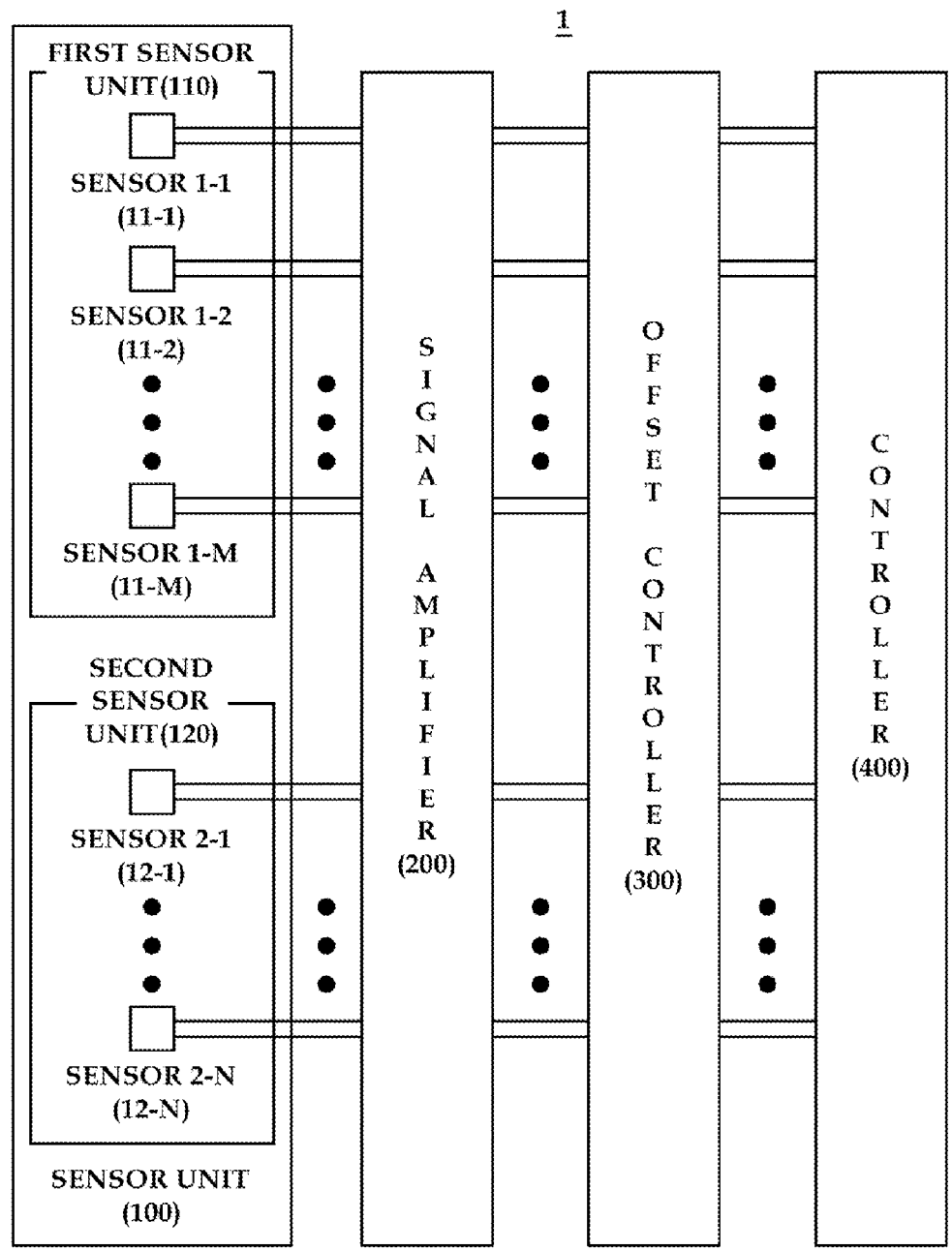
FIG. 1 is a diagram illustrating an example of a sensing system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of a sensing system.

As illustrated in the example of FIG. 1, a sensing system 1 includes a sensor unit 100 configured to sense magnetic force of an additional magnetic module through a plurality of sensors 11, 12 that are arranged in a 3 dimensional structure; and a controller 400 configured to identify a relative position of a second body which includes the magnetic module, to a first body having the sensor unit 100, by using values sensed by each sensor in the sensor unit 100. In this example, the sensor unit 100 includes a first sensor unit 110 which includes one or more sensors formed on a first plane; and a second sensor unit 120 which includes one or more sensors formed on a second plane which is parallel to and isolated from the first plane by a certain interval. In one example, the first sensor unit 110 includes a total of M sensor(s) of sensors 1-1(11-1) to 1-M(11-M), and the second sensor unit 120 consists of a total of N sensor(s) of sensors 2-1(12-1) to 2-N(12-N). N may be equal to or smaller than M. In FIG. 1, sensors inside the first sensor unit 110 are a first sensor 11, and sensors inside the second sensor unit 120 are a second sensor 12. These structures may be identical to each other and may be referred to generally as a sensor 10, if necessary.

Additionally, the sensing system 1 may further include a signal amplifier 200 configured to amplify values sensed by each sensor 11, 12 by a certain ratio; and an offset controller 300 configured to control offsets of values sensed by each sensor 11, 12.

The sensor unit 100 includes a plurality of sensors 11, 12. The sensor may be a Hall sensor capable of detecting magnetic force. For example, the number of Hall sensors that are applied in the sensor units may be modified, according to a device characteristic, measurement credibility, and an application.

An example of the sensor will be described with reference to FIGS. 2a and 2b.

Figure 2A:
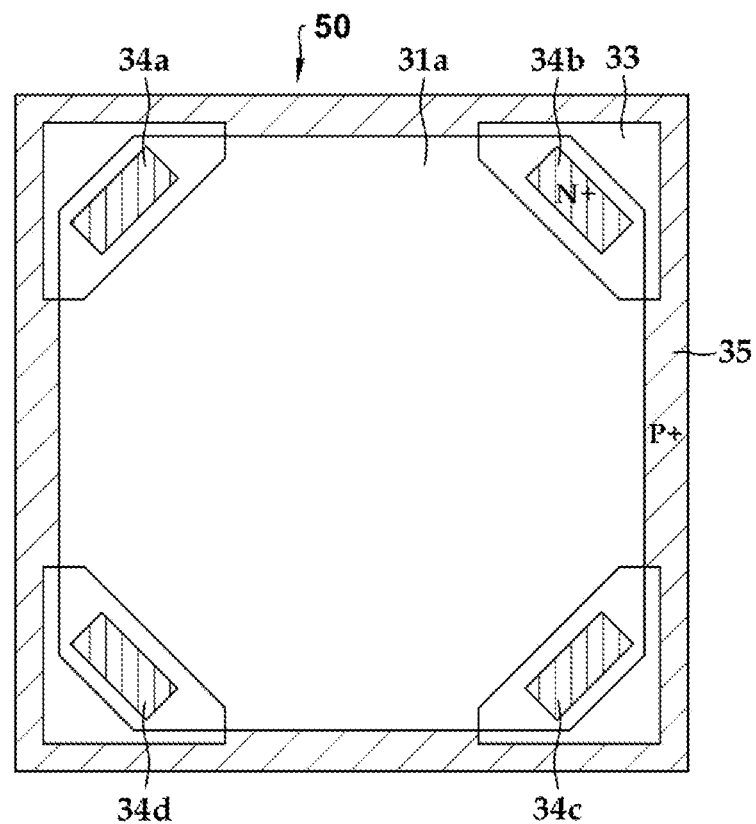
FIGS. 2a and 2b are diagrams illustrating an example of a sensor.
Figure 2B:
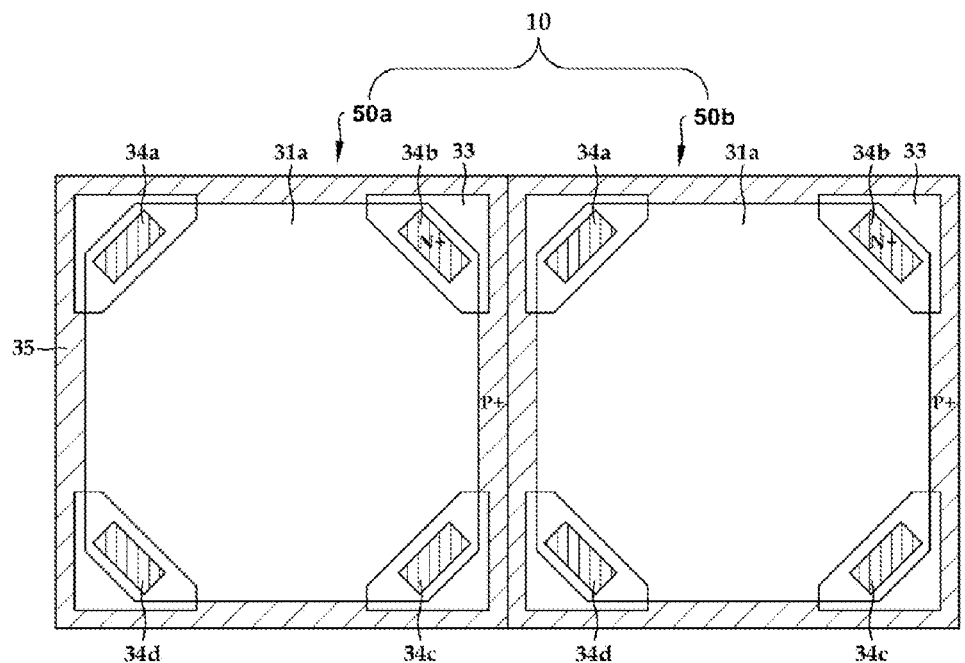

FIGS. 2a and 2b are diagrams illustrating an example of a sensor.

As illustrated in FIG. 2a, a sensor may be a Hall sensor based on a semiconductor consisting of one Hall sensor 50.

Specifically, a Hall sensor based on a semiconductor according to an example may include one Hall device 50 that is formed on a semiconductor substrate. The Hall device 50 may include a sensing region 31a whose flat surface is octagonal, and first conductive type (N+) first to fourth electrodes 34a, 34b, 34c, 34d having high concentrations that are formed at four edge sides of the sensing region 31a.

The first and third electrodes 34a, 34c that face each other are configured to measure a current on the sensing region 31a, and the second and fourth electrodes 34b, 34d that face each other are configured to be arranged vertically to the first and the third electrodes 34a, 34c and to measure a change in voltage. In the sensing region 31a, it is preferable that the lengths of the four side edges in which the first to the fourth electrodes 34a, 34b, 34c, 34d are formed are shorter than those of the four sides in which the first to the forth electrodes 34a, 34b, 34c, 34d are not formed.

Further, the first to fourth electrodes 34a, 34b, 34c, 34d are rectangular. It is preferable that a wider side is inclined at an angle of 45° from lines in contact with the outer circumferential surface of the sensing region 31*a*. Therefore, a large quantity of current can flow into the sensing region 31*a* and a small change in voltage can be easily detected.

The semiconductor substrate is a region doped in a P-type. The sensing region 31*a* is a region doped in an N-type, i.e., Deep N Well (DNW). It is preferable that the sensing region 31*a* is a magnetic sensing region.

In addition, the first to the fourth electrodes 34*a*, 34*b*, 34*c*, 34*d* are doped in an N-type concentration higher than the sensing region 31*a*. This may be done for lowering a resistance resulting from contact with a contact plug (not illustrated).

As illustrated in this example, the first to the fourth electrodes 34*a*, 34*b*, 34*c*, 34*d* may be rectangular. They are arranged in a manner such that a wider side heads to a center.

In addition, a P-type doping region 35 having a high concentration is formed on the sensing region 31*a* in which the first to the fourth electrodes 34*a*, 34*b*, 34*c*, 34*d* are formed. Thus, the substrate surface has a second conductive type (a P-type) doping region 35 being exposed. The doping region 35 in the outer edge may be used for applying a voltage to an additional P-type well in the semiconductor substrate. To this end, the doping region 35 is formed as a P-type dopant region having a higher concentration than the P-type well. It is preferable that a doping concentration of the second conductive type doping region is higher than that of the sensing region. This is for preventing a depleted layer from being extended even to the substrate surface due to the dose of the sensing region.

An insulating layer 33 is formed between the first to the forth electrodes 34*a*, 34*b*, 34*c*, 34*d*, and the doping region 35. Also, an insulating layer 33 surrounds the first to the fourth electrodes 34*a*, 34*b*, 34*c*, 34*d* so that they are separate from the doping region.

The doping region 35 is formed to surround four sides of the first to the fourth electrodes 34*a*, 34*b*, 34*c*, 34*d*. The P-type well is formed at a bottom portion of the doping region 35 outside the sensing region 31*a*. By forming the P-type doping region 35 on the substrate surface of the semiconductor, unevenness or defects of the semiconductor material in the DNW sensing region 31*a* can be offset. Thus, offset voltage in the Hall device is reduced, thereby, characteristics of the device can be improved, and thereby, uniformity in the Hall voltage can be enhanced as well.

Further, as illustrated in FIG. 2*b*, a sensor may be a Hall sensor based on a semiconductor consisting of a plurality of Hall devices 50.

For example, as illustrated in FIG. 2*b*, a sensor 10 may be a Hall sensor consisting of two Hall devices 50*a*, 50*b*. As arranged in FIG. 2*b*, when two Hall devices 50*a*, 50*b* are arranged to be adjacent to each other in a pair, sensitivity of the Hall voltage can be higher than when one Hall device is arranged. A first Hall device 50*a* and a second Hall device 50*b* may be isolated from each other by a certain interval. In another example, four Hall devices may be arranged in a pair. The greater the number of Hall device, the easier a change in the Hall voltage and an offset voltage can be controlled. This is because a change in a magnetic force can be detected more delicately according to the arrangement and number of the Hall sensor when a magnetic flux having a vertical or a horizontal direction arrives at the Hall device. It is noted that any number of Hall devices may be used, and a sensor 10 may include any variety of Hall sensors.

A sensor unit 100 may be formed with sensors arranged in a 3 dimensional structure. More specifically, the sensor unit 100 may include a first sensor unit 110 which includes one or more sensors formed on a first plane; and a second sensor unit 120 which includes one or more sensors formed on a second plane that is parallel and isolated from the first plane by a certain interval.

It is preferable that each sensor in the second sensor unit 120 is arranged with each sensor in the first sensor unit 110 in a vertical direction. In the present disclosure, for easy explanation, transversal direction, longitudinal direction and vertical direction refer to the X axis, Y axis, and Z axis, respectively.

In all drawings and the detailed description of the present disclosure, for easy explanation, a second plane is formed underneath a first plane. However, in various examples, the second plane can also be formed above the first plane or in other locations with respect to the first plane.

Hereinafter, examples of the arrangement structure of the plurality of sensors will be described with reference to FIGS. 3*a* to 5*b*.

Figure 3A:
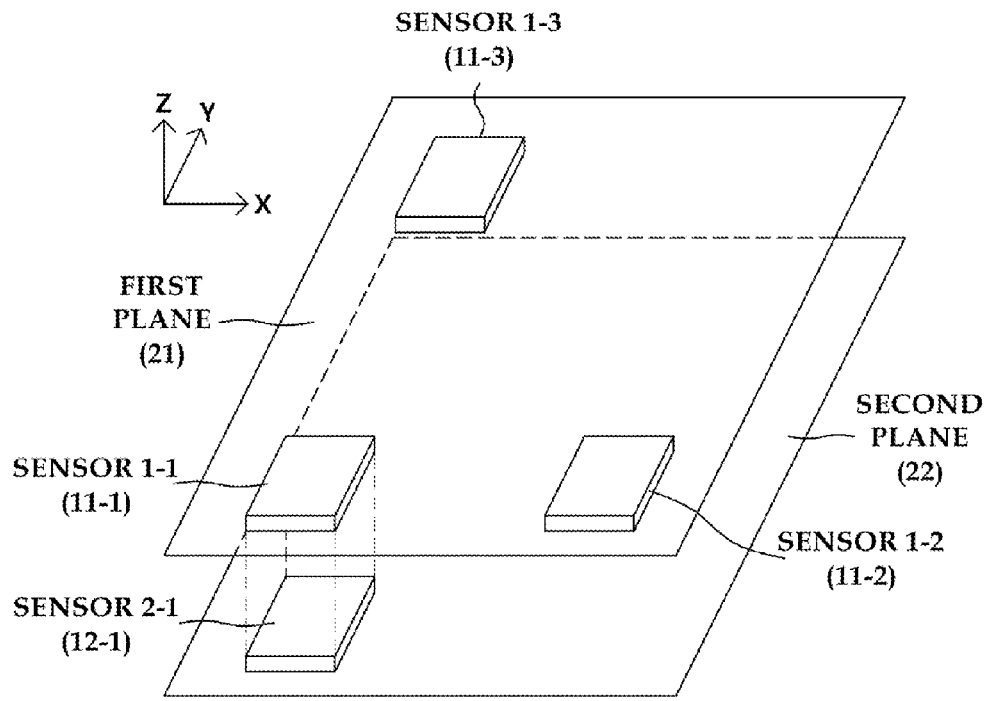
FIGS. 3a and 3b are diagrams illustrating an example of arrangement structures of sensors in a sensor unit.
Figure 3B:
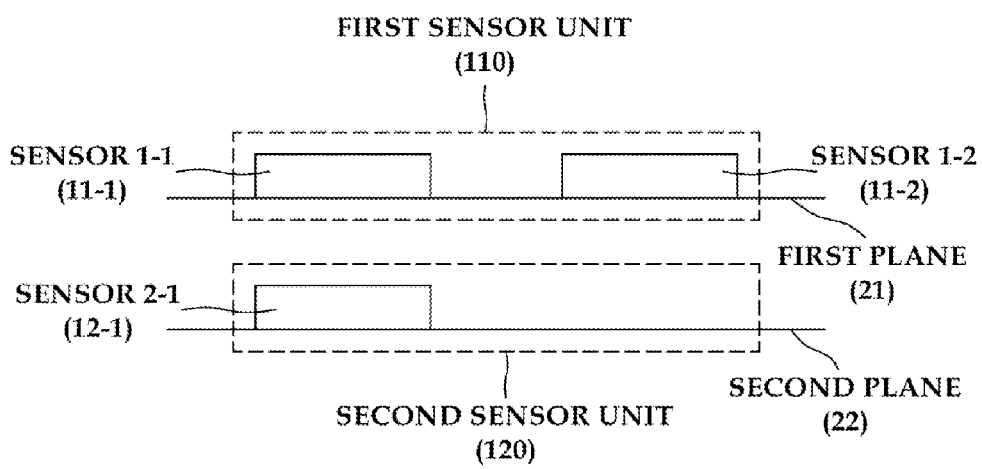

FIGS. 3*a* and 3*b* are diagrams illustrating an example of arrangement structures of sensors in a sensor unit.

As illustrated in FIG. 3*a*, a first sensor unit 110 consisting of three sensors 11 may be arranged on a first plane 21 of the sensor unit 100. The three sensors 11 can be arranged in such a manner that two sensors 11-2, 11-3 are isolated on the X axis and the Y axis directions respectively and one sensor 11-1 is a standard. Hereinafter, for easy explanation, the standard sensor 11 will be referred to as sensor 1-1 (11-1) and the two sensors arranged on the X and Y axes directions will be referred to as sensor 1-2 (11-2) and sensor 1-3 (11-3).

In FIG. 3*a*, sensor 1-2 (11-2) is isolated in a right X axis direction from sensor 1-1 (11-1) and sensor 1-3 (11-3) is isolated in an upward Y axis direction from the sensor 1-1 (11-1). However, the sensor 1-2 (11-2) can be isolated in a left X axis direction from the sensor 1-1 (11-1) and the sensor 1-3 (11-3) can be isolated in a downward Y axis direction from the sensor 1-1 (11-1).

In this example, the isolation distance among the sensor 1-1 (11-1), the sensor 1-2 (11-2), and the sensor 1-3 (11-3) can vary according to characteristics of the device and the magnetic module to be sensed.

Also, there may be a sensor unit 120 in which one or more second sensors 12 are included on a second plane 22 that is parallel and isolated from the first plane 21. Although FIG. 3*b* illustrates that only sensor 2-1 (12-1) is formed on the second plane 22, a plurality of second sensors 12 may be formed according to various examples.

As illustrated in FIG. 3*a*, the sensor 2-1 (12-1) can be arranged or aligned with sensor 1-1 (11-1) in a Z axis direction. In other examples, the sensor 2-1 (12-1) can be arranged or aligned with sensor 1-2 (11-2) or sensor 1-3 (11-3) in a Z axis direction.

Also, the sensor 2-1 (12-1) can be arranged with the sensor 1-1 (11-1) or the sensor 1-2 (11-2) or the sensor 1-3 (11-3) in a Z axis direction, and can be arranged between sensors 1-1 (11-1) and 1-2 (11-2) of the first sensor unit 110, and not aligned with the sensors of the first sensor unit 110 (not illustrated). Or, the sensor 2-1 (12-1) can be arranged between the sensors 1-2 (11-2) and 1-3 (11-3) (not illustrated). Because arrangement is not always implemented upon production methods, in order to enhance the degree of freedom of the process, the sensor 2-1 (12-1) can be arranged between the sensors in the first sensor group. In this regard, the second sensor formed in the second sensor unit 120 may be arranged toward the first sensor unit in a Z axis direction and may also be arranged between the sensors in the first sensor unit.

The plurality of sensors can be formed on one wafer, or may be formed in such a manner that they are laminated by a certain shape structure, according to production methods. As for the formation, various production processes can be applied. For example, the first sensor unit 110 may be formed on a first wafer, and then, a first sensor packaging module (not illustrated) may be formed by packaging thereof. Likewise, the second sensor unit 120 may be formed on a second wafer, and then, a second sensor packaging module (not illustrated) may be formed by packaging thereof.

Additionally, the first and the second packaging modules may be formed by stacking in parallel and mounting in a sensing system (e.g., a display device). The first sensor unit may be formed on the wafer, with many analogue or digital circuits configured therein, so as to deliver and receive signals. Also, a metal wiring layer may be formed. A packaging, such as forming a bump, may be performed to form a passivation layer and to open a pad electrode. This should connect the pad electrode with the outer voltage. To reduce a size of the package, packaging can be implemented as a wafer level chip scale packaging (WLCSP) which operates similarly regarding a chip size. The same production methods may also be applied to the second sensor unit 120.

Accordingly, the sensing system may have a sensor unit in which the first sensor packaging module and the second sensor packaging module are stacked. The sensor unit 100 as above may be configured in a lateral structure as shown in FIG. 3b.

Figure 4A:
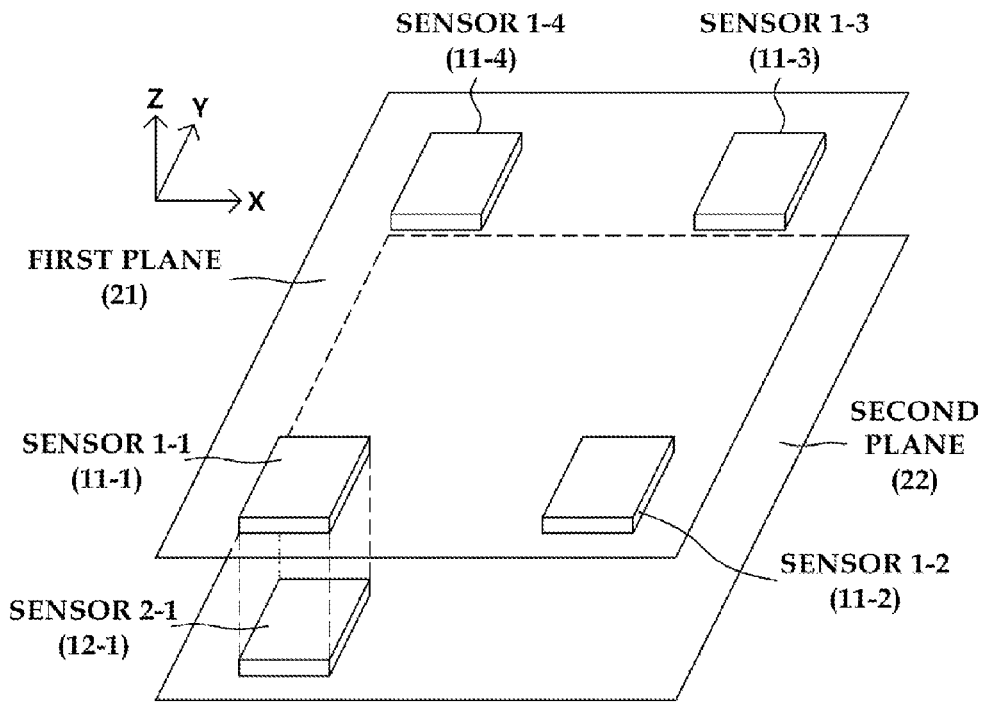
FIGS. 4a and 4b are diagrams illustrating an example of arrangement structures of sensors in a sensor unit.
Figure 4B:
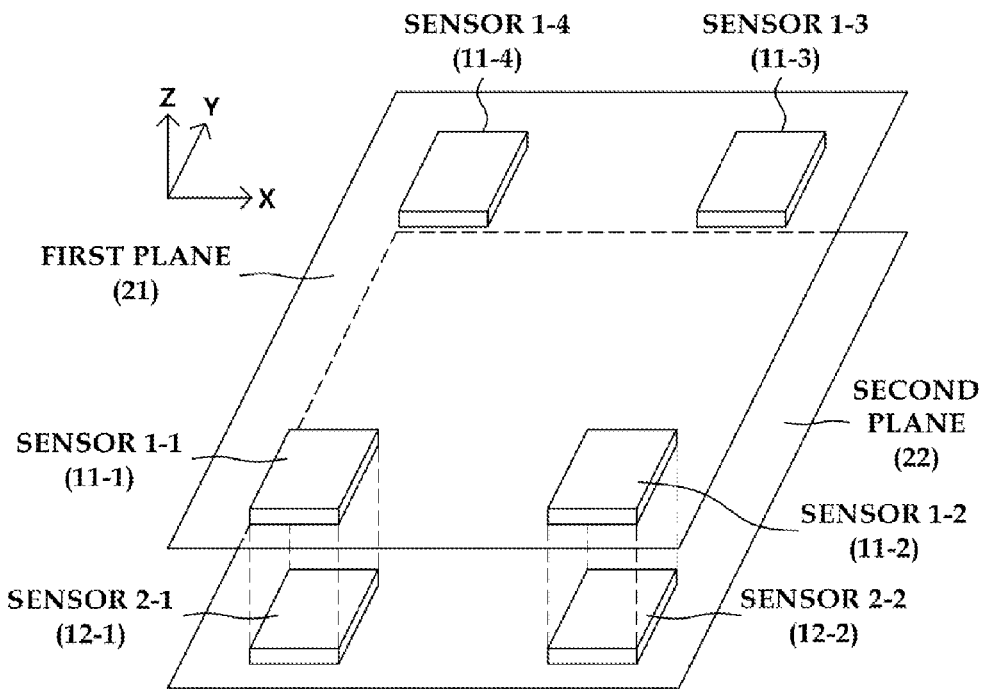

FIGS. 4a and 4b are diagrams illustrating an example of arrangement structures of sensors in a sensor unit.

As illustrated in FIG. 4a, the sensor unit 100 may include four first sensors 11 formed on a first plane 21, and one or more second sensors 12 formed on the second plane 22 and arranged or aligned in a Z axis direction with any of the four first sensors 11.

For example, sensors 1-1 to 1-4 (11-1, 11-2, 11-3, 11-4) are arranged on the first plane 21 in a square shape. In an example, sensor 2-1 (12-1) may be arranged or aligned with sensor 1-1 (11-1) in a Z axis direction.

In other examples, a plurality of second sensors 12 can be formed on the second plane 22. For example, as illustrated in FIG. 4b, sensors 2-1 (12-1) and 2-2 (12-2) may be arranged or aligned with sensor 1-1 (11-1) and sensor 1-2 (11-2), respectively, in a Z axis direction.

FIGS. 4a and 4b illustrate examples of structures where sensors 2-1 (12-1) and 2-2 (12-2) are arranged or aligned with sensors 1-1 (11-1) and 1-2 (11-2) in a Z axis direction, respectively; however, sensors 2-1 (12-1) and 2-2 (12-2) may also be arranged to other sensors 1-3 (11-3) and 1-4 (11-4) in a Z axis direction.

Figure 5A:
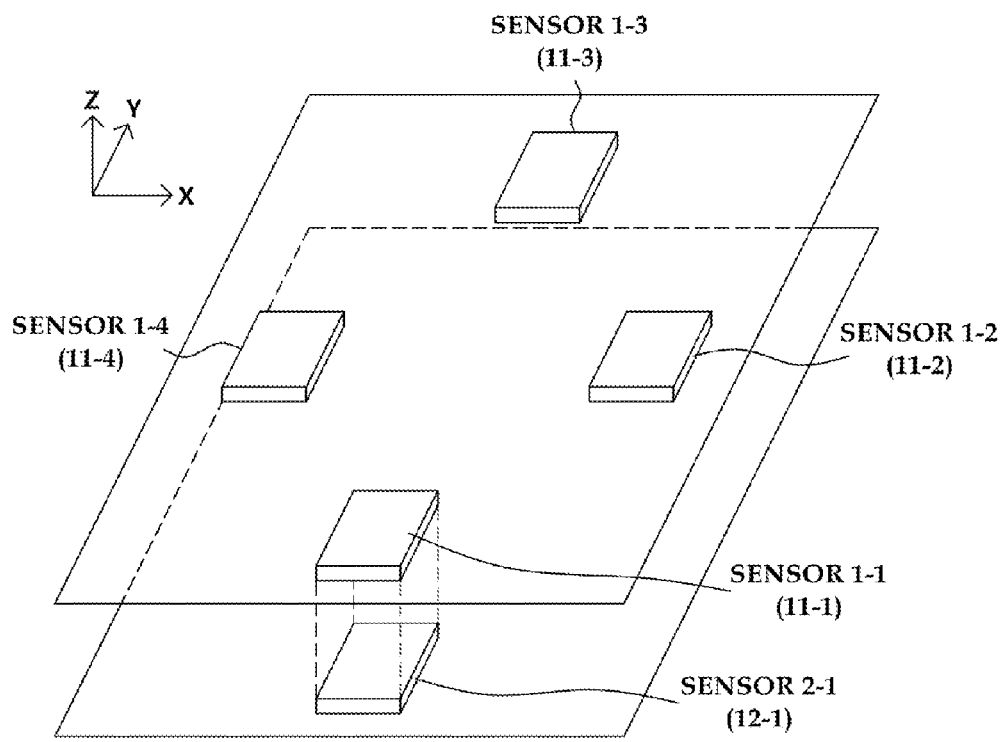
FIGS. 5a and 5b are diagrams illustrating an example of arrangement structures of sensors in a sensor unit.
Figure 5B:
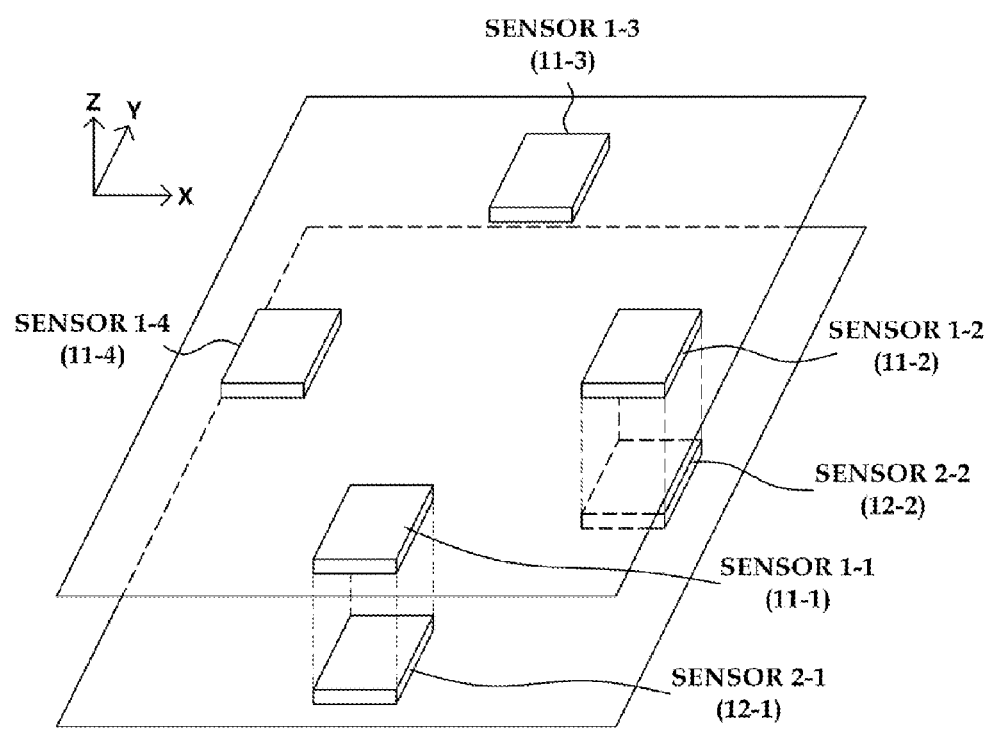

FIGS. 5a and 5b are diagrams illustrating examples of arrangement structures of sensors in sensor unit according to another example.

As illustrated in FIG. 5a, sensors 1-1 to 1-4 (11-1, 11-2, 11-3, 11-4) may be arranged in a diamond shape or a cross shape on the first plane 21. Sensor 2-1 (12-1) can be arranged or aligned with sensor 1-1 (11-1) in a Z axis direction.

In other examples, a plurality of second sensors 12 may be formed on a second plane 22. For example, as illustrated in FIG. 5b, sensors 2-1 (12-1) and 2-2 (12-2) may be arranged or aligned with sensor 1-1 (11-1) and sensor 1-2 (11-2), respectively, in a Z axis direction.

FIGS. 5a and 5b illustrate structures where sensors 2-1 (12-1) and 2-2 (12-2) are arranged respectively to correspond or be aligned with sensors 1-1 (11-1) and 1-2 (11-2) in a Z axis direction. However, they may also be arranged to correspond or be aligned with other sensors 1-3 (11-3), 1-4 (11-4) in a Z axis direction.

Figure 6:
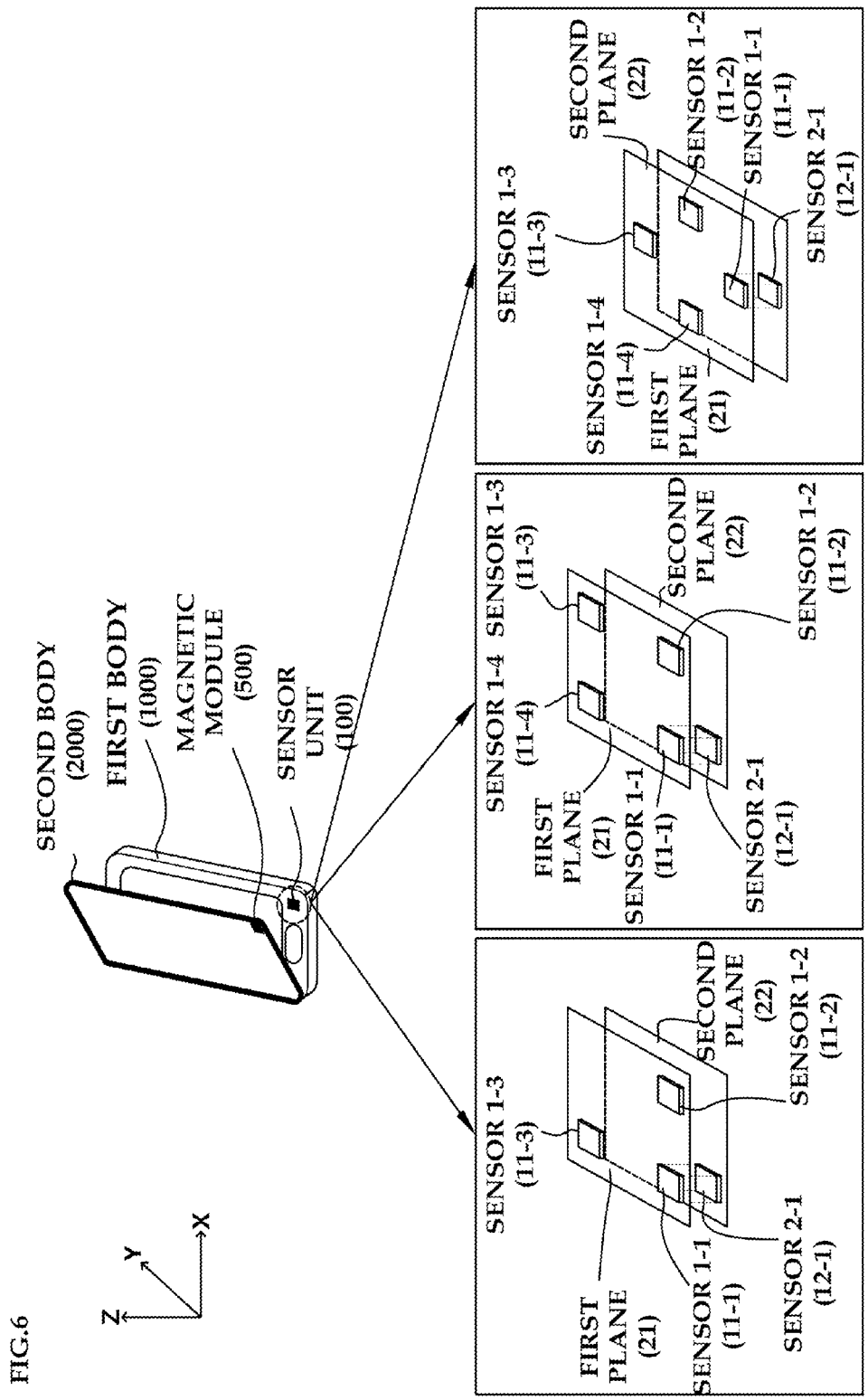
FIG. 6 is a diagram illustrating examples of arrangement structures of sensor units as applied to a sensing system.

FIG. 6 is a diagram illustrating an example of arrangement structures of sensor units as applied to a sensing system.

As illustrated in FIG. 6, the sensor unit 100 may be formed on a surface of a first body 1000. In an example, the first body 1000 may be a structure of electronic equipment. For example, the sensor unit 100 may be configured into certain portions of a mobile, a PDA, a tablet PC, a notebook PC, or other electronic equipment.

As described above, a sensor unit 100 formed on one surface of the first body 1000 is configured to sense magnetic force of a magnetic module 500 formed on a second body 2000. The second body 2000 may be an additional structure that is not the first body 1000 or a structure that is connected to the first body 1000. That is, the first and the second bodies 1000, 2000 are attachable and detachable with each other and may be connected to be driven.

For example, an additional ornament (a second body 2000) may be combined with a mobile (a first body 1000), or a monitor (a second body 2000) of a notebook PC may be connected with a keyboard (a first body 1000) of a notebook PC to be capable of being driven partially. In the example of FIG. 6, mobile equipment and an additional ornament connected thereto are illustrated. However, the present disclosure is not limited thereto.

As for the sensor unit 100, any one arrangement of the sensor unit 100 may be applied such as the examples illustrated in FIGS. 3a, 4a and 5a. Also, any arrangement in the sensor unit 100 from FIGS. 4b and 5b can be applied. Additionally, other arrangements can be applied. As mentioned above, the sensor unit 100 consists of a first sensor unit 110 and a second sensor unit 120. The units are formed by packaging a first sensor and a second sensor. For example, the first sensor unit 110 is formed on a first wafer, and a first sensor packaging module (not illustrated) is formed by packaging thereof. Likewise, the second sensor unit is formed on a second wafer, and a second sensor packaging module (not illustrated) is formed by packaging thereof. Additionally, the first and the second packaging modules can be mounted on a sensing system (e.g., a display device) by stacking them. The first sensor unit is formed on the wafer and analogue or digital circuits may be configured therein so as to deliver and receive signals. Also, a metal wiring layer can be formed. A packaging, such as forming a bump, may be performed to form a passivation layer, to open a pad electrode, and to connect the pad electrode with the outer voltage. Packaging can be a wafer level chip scale packaging (WLCSP) which similarly operates regarding a chip size so as to reduce a size of the package.

A controller 400 may be configured to identify a relative position of a second body 2000 having an additional magnetic module 500 to a first body 1000 which includes a sensor unit 100 by using values sensed by each sensor in the sensor unit 100. In this example, a method of identifying a relative position of a magnetic module 500 (or a second body 2000) with respect to the first body 1000 will be described in detail with reference to FIGS. 7a to 8b.

Figure 7A:
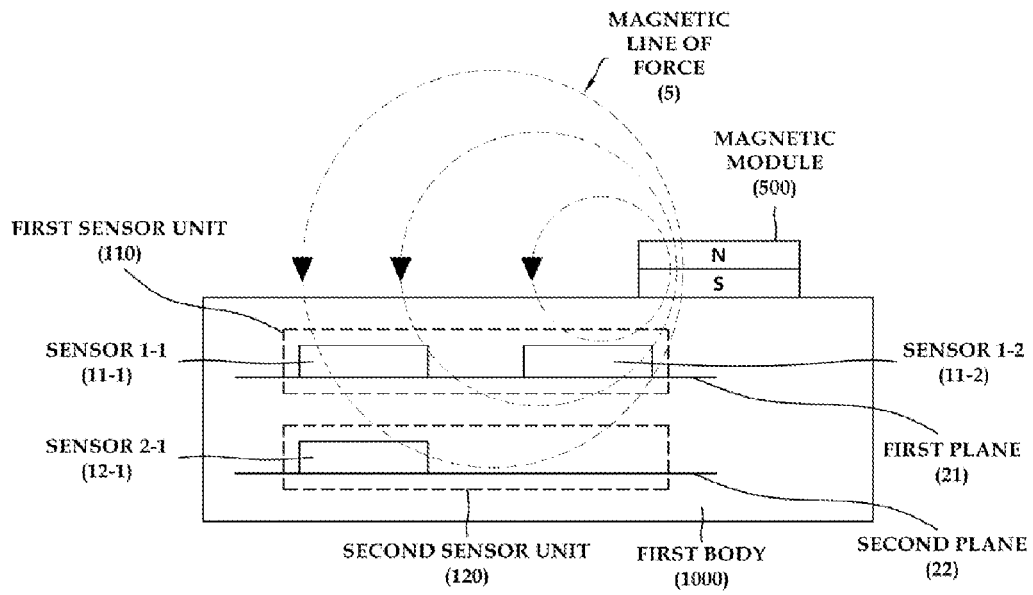
FIGS. 7a and 7b are diagrams illustrating an example of a method of identifying a relative position of an additional magnet module against a sensor unit.
Figure 7B:
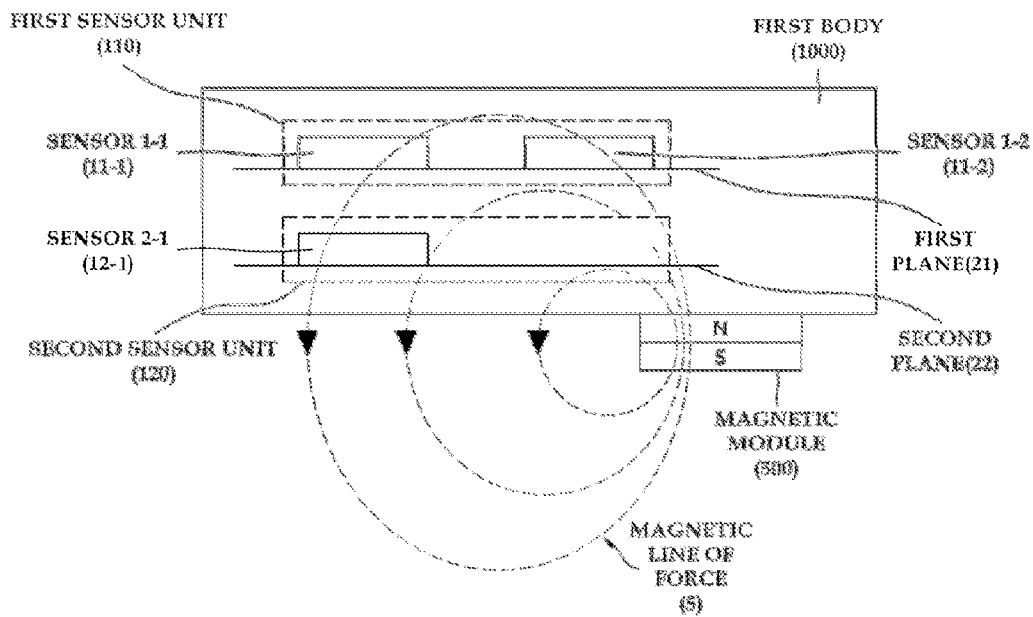

FIGS. 7a and 7b are diagrams illustrating an example of a method of identifying a relative position of an additional magnet module with respect to a sensor unit.

As illustrated in FIG. 7a, sensor unit 100 which includes a first sensor unit 110 and a second sensor unit 120, is included in a first body 1000. In this example, FIG. 7a illustrates that the sensor unit 100 is formed inside the first body 1000. However, the sensor unit 100 can be formed on a surface of the first body 1000. The sensor unit 100 can be formed at various positions within the first body 1000 or on one or more surfaces of the first body 1000. The position of the sensor unit 100 is not limited by the accompanying drawings.

Referring to FIG. 7a, sensors 1-2 (11-2) and 2-1 (12-1), which are arranged in a Z axis direction, detect magnetic force of a magnetic module 500, respectively. The magnetic module 500 consists of an N pole and an S pole. A magnetic line of force 5 is generated from an N pole to an S pole. That is, the magnetic line of force comes from the N pole and heads to the S pole. If the magnetic module 500 is positioned at an upper side of the first body 1000, the magnetic force detected by the sensor 1-2 (11-2) becomes greater than the magnetic force detected by the sensor 2-1 (12-1). This is because the sensor 1-2 (11-2) is positioned closer to the magnetic module 500, than the sensor 2-1 (12-1).

In another example, as illustrated in FIG. 7b, if the magnetic module 500 is positioned at a bottom side of the first body 1000, the magnetic force detected by the sensor 1-2 (11-2) becomes smaller than the magnetic force detected by the sensor 2-1 (12-1). This is because, unlike in the example illustrated in FIG. 7a, the sensor 2-1 (12-1) is positioned closer to the magnetic module 500 than the sensor 1-2 (11-2 because the magnetic module 500 is positioned at a bottom side of the first body 1000.

By configuring sensors in sensor unit 100 to be laminated or stacked in a 3 dimensional structure as described above, results obtained by comparing the magnitude of the values sensed by both sensors that are arranged in a Z axis direction would be changed according to a relative position of the magnetic module 500 to the sensor unit 100 (or the first body 1000). Therefore, through the results, it can be clearly identified whether the magnetic module 500 is positioned at an upper or a bottom side relative to the sensor unit 100.

Figure 8A:
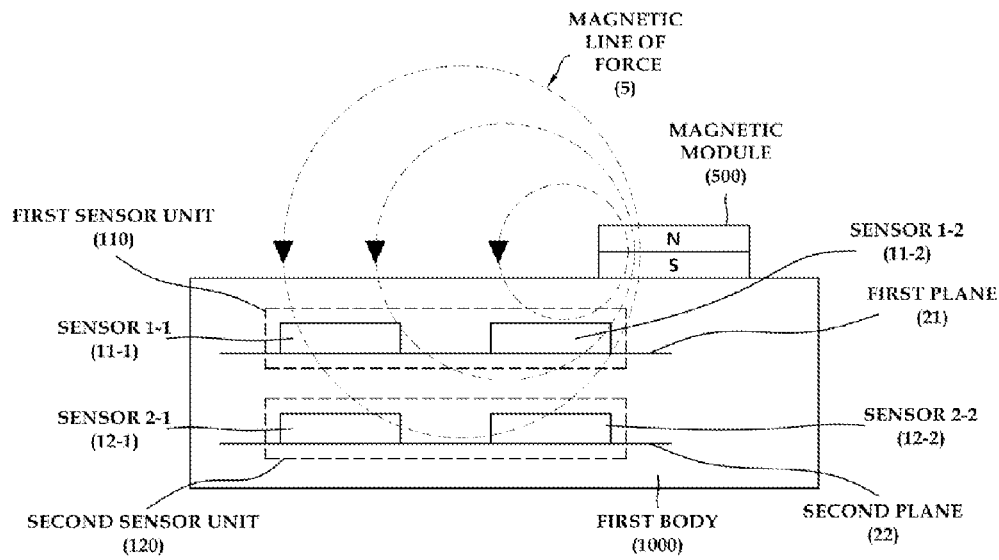
FIGS. 8a and 8b are diagrams illustrating an example of a method of identifying a relative position of an additional magnetic module against a sensor unit.
Figure 8B:
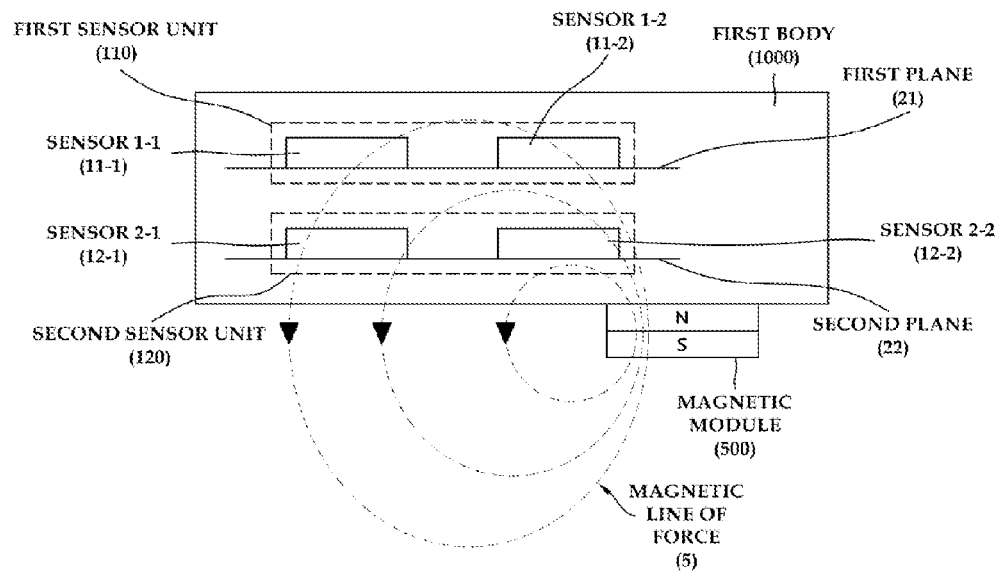

FIGS. 8a and 8b are diagrams illustrating a method of identifying a relative position of an additional magnetic module with respect to a sensor unit.

Referring to FIGS. 8a and 8b, magnitude of the magnetic force detected by the sensor 1-2 (11-2) and magnitude of the magnetic force detected by the sensor 2-2 (12-2) can be compared to each other and to the examples of FIGS. 7a and 7b. In an example method of identifying a relative position of the magnetic module 500, a higher credibility can be obtained by additionally using comparison results of magnetic force detected by sensors 1-2 (11-2) and 2-2 (12-2).

In this example, the controller 400 can judge whether the second body 2000, including the magnetic module 500, is attached with the first body 1000 by judging relative position data of the magnetic module 500 (or the second body 2000) with respect to the sensor unit 100. This may be obtained by the above method and by further judging whether a maximum value is equal to or more than a threshold value that is set in advance, among values sensed by each sensor. For example, the threshold value can be preset or input by a user.

That is, the controller 400 can judge that the second body 2000, which includes the magnetic module 500, is positioned at an upper side of the sensor unit 100 when the sensor unit 100 is formed on one surface of the first body 1000 formed of an additional display portion (not illustrated). Also, the controller 400 can judge that the second body 2000 is attached to a surface of the first body 1000 when that sensed value by a certain sensor 10 is equal to or more than threshold value.

In another example, the controller 400 can turn an additional display portion (not illustrated) on and off by using data regarding the attachment. Specifically, the controller 400 can turn the additional display portion off in response to determining that the second body 2000 is attached to a side of the first body 1000. In response to determining that the second body 2000 is not attached to a side of the first body 1000, the additional display portion can be turned on.

Further, a first sensor unit 110 that is formed on the first plane 21 can include a plurality of sensors, and a controller 400 can additionally identify the second body by using values sensed by the plurality of sensors in the first sensor unit 110. Specifically, the controller 400 is configured to detect at least one of polarity, position, intension of the magnet module 500 by collecting values sensed by each sensor in the first sensor unit 110 and identifying the second body 2000 through the detected data.

It is preferable that the controller 400 detects magnetic force transferred by the magnetic module 500 by using values sensed by each sensor in the first sensor unit 110 which are amplified by the signal amplifier 200. Now that a voltage of an output value that is generated at a certain Hall sensor is a very small voltage, a higher credibility in the controller 400 can be obtained with respect to magnetic force of the magnetic module 500 by amplifying the sensed values using the signal amplifier 200.

Additionally, the controller 400 can detect magnetic force transferred by the magnetic module 500 by using values sensed by each sensor in the first sensor unit 110 that is controlled by the offset controller 300. In the controller 400, magnetic force of the magnetic module 500 can be detected in a higher credibility because sensed values are controlled by the offset controller 300.

In other examples, the controller 400 can control an additional display portion to be operated in different modes according to identification data of the identified second body 2000. For example, in determining that a second body 2000 corresponds to 'Type 1', the controller 400 can control video data to be output, which corresponds to 'Type 1', at an additional display portion (not illustrated). Also, the controller 400 can control an additional display portion (not illustrated) to output a form of an icon, a font size, and video data, differently from an original operation mode. It should be appreciated by those skilled in the art that many structures which operate in modes different from an original mode may be used in the various forms without departing from the substantial characteristics of the present disclosure.

According to an example, an apparatus using the sensing system 1 includes a first body 1000, a second body 2000 in which a magnetic module 500 is formed, configured to be attachable and detachable with the first body 1000, a sensor unit 100 in which a plurality of sensors are arranged in a 3 dimensional structure formed at a side of the first body 1000 to sense magnetic force of the magnetic module 500 formed at the additional second body 2000, and a controller 400 configured to identify a relative position of the second body 2000 to the first body 1000 by using values sensed by each sensor in the sensor unit 100. The apparatus using the sensing system 1 may further include a signal amplifier 200 configured to amplify values sensed by each sensor with a certain ratio and an offset controller 300 configured to control offsets of values sensed by each sensor.

The apparatus having the sensing system 1 configured as above relates to a structure including the first body 1000 and second body 2000. Other examples which are substantially identical to the above described example will be omitted hereinafter.

In various aspects, a sensing apparatus and an apparatus using the sensing apparatus allow a relative position of an additional magnetic module to a sensor unit configured to sense magnetic force to be identified by arranging a plurality of Hall sensors in a 3 dimensional structure.

It can be identified whether a second body comprising an additional magnetic module is positioned at an upper or a bottom portion based on a position of a first body comprising the sensor unit. This determination can be made by using a sensor unit configured to sense magnetic force and comparing values sensed by a plurality of sensors that are arranged or aligned in a Z axis direction.

Additionally, by configuring a plurality of Hall sensors on a plane, a second body comprising an additional magnetic module can be identified by using sensing data of the plurality of sensors.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

What is claimed is:

1. A sensing apparatus, comprising:
   a first sensor unit comprising a sensor formed on a first X,Y plane; and a second sensor unit comprising another sensor formed on a second plane, wherein the another sensor of the second sensor unit is displaced from the first sensor in a Z axis direction, and wherein each sensor of the first and the second sensor units is a Hall sensor comprising a Hall device which comprises;

a conductive type sensing region configured to detect a change in a magnetic field;

first and third electrodes that face each other along a first line and are configured to provide a measured current on the sensing region; and second and fourth electrodes that are arranged to face each other along a second line that is perpendicular to the first line and are configured to measure a change in voltage.

2. The sensing apparatus of claim 1, wherein the second plane is parallel to the first plane, and the another sensor of the second sensor unit is aligned with the sensor of the first sensor unit in the Z axis direction.

3. The sensing apparatus of claim 1, further comprising:
a first sensor packaging module comprising the first sensor unit; and
a second sensor packaging module comprising the second sensor unit.

4. The sensing apparatus of claim 3, wherein the first sensor packaging module and the second sensor packaging module are stacked.

5. The sensing apparatus of claim 1, wherein the another sensor of the second sensor unit is aligned with the sensor of the first sensor unit.

6. The sensing apparatus of claim 1, wherein the another sensor of the second sensor unit is not aligned with the sensor of the first sensor unit.

7. A device using a sensing apparatus, comprising:
a first body comprising a sensor unit; and
a second body comprising a magnetic module and configured to be attachable and detachable with the first body;
wherein the sensor unit comprises a plurality of sensors arranged in a first X,Y plane and another sensor arranged in a second plane, and
wherein each sensor of the sensor unit is a Hall sensor comprising a Hall device which comprises:
a conductive type sensing region configured to detect a change in magnetic field;
first and third electrodes that face each other along a first line and are configured to provide a measured current on the sensing region; and
second and fourth electrodes that face each other along a second line arranged perpendicular to the first line and measure a change in voltage.

8. The device of claim 7, further comprising a controller configured to determine a location of the second body relative to the first body by using the plurality of sensors of the sensor unit, wherein the sensor unit is formed at a side of the first body to sense a magnetic field formed at the second body.

9. The device of claim 7, wherein the second plane is parallel to and separated from the first plane by a certain interval.

10. The device of claim 9,
wherein the another sensor is aligned with a first sensor of the plurality of sensors in a Z axis direction.

11. The device of claim 9, wherein a controller is configured to identify a relative location of the magnetic module with respect to the first body by comparing values output by each of the plurality of sensors and the another sensor.

12. The device of claim 8, wherein the controller is configured to determine whether the second body is attached to the first body by using the determined relative location of the second body with respect to the first body.

13. The device of claim 9, wherein the another sensor is aligned in the Z axis direction with a position between sensors of the plurality of sensors in the first X,Y plane.

14. A device, comprising:
a first body;
a second body;
a first sensor and a second sensor arranged at the first body on a first X,Y plane;
a third sensor which is vertically aligned with the first sensor in a Z axis direction and arranged at a second plane of the first body which is parallel to the first plane, and
wherein each of the first, second and third sensors is a Hall sensor comprising a Hall device which comprises:
a conductive type sensing region configured to detect a change in magnetic field;
first and third electrodes that face each other along a first line and are configured to provide a measured current on the sensing region; and
second and fourth electrodes that face each other along a second line arranged perpendicular to the first line and measure a change in voltage.

15. The device of claim 14, wherein the first, second, and third sensors are configured to provide values for determining a relative location of the second body with respect to the first body.

16. The device of claim 15, further comprising a controller, wherein in response to the values provided by the first, second, and third sensors, the controller generates a control signal.

17. The device of claim 14, further comprising a magnetic module which is formed at the second body and generates magnetic fields which are detected by the first, second, and third sensors for determining a relative location of the second body with respect to the first body.

18. The sensing apparatus of claim 1, wherein the first sensor unit comprises a plurality of sensors formed on the first X,Y plane.

* * * * *